United States Patent
Xu et al.

(10) Patent No.: US 12,224,512 B2
(45) Date of Patent: Feb. 11, 2025

(54) CIRCUIT BOARD ASSEMBLY, BACKPLANE INTERCONNECTION SYSTEM, AND ELECTRONIC DEVICE

(71) Applicant: HUAWEI TECHNOLOGIES CO., LTD., Guangdong (CN)

(72) Inventors: Huahua Xu, Dongguan (CN); Xinhu Gong, Shenzhen (CN); Yinzhong Tang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 366 days.

(21) Appl. No.: 17/680,659

(22) Filed: Feb. 25, 2022

(65) Prior Publication Data

US 2022/0181810 A1    Jun. 9, 2022

Related U.S. Application Data

(63) Continuation of application No. PCT/CN2020/106487, filed on Aug. 1, 2020.

(30) Foreign Application Priority Data

Aug. 26, 2019   (CN) .......................... 201910791746.1

(51) Int. Cl.
*H01R 12/72* (2011.01)
*H05K 7/14* (2006.01)

(52) U.S. Cl.
CPC ......... *H01R 12/721* (2013.01); *H01R 12/722* (2013.01); *H05K 7/1441* (2013.01); *H05K 7/1452* (2013.01)

(58) Field of Classification Search
CPC .. H01R 12/721; H01R 12/722; H05K 7/1441; H05K 7/1452
(Continued)

(56) References Cited

U.S. PATENT DOCUMENTS 5,260,854 A     11/1993   Hileman et al.
9,591,781 B2 *   3/2017   Vanderveen ............. H05K 1/14
(Continued)

FOREIGN PATENT DOCUMENTS

CN    1246739 A       3/2000
CN    102133702 A     7/2011
(Continued)

OTHER PUBLICATIONS

International Search Report and Written Opinion issued in PCT/CN2020/106487, dated Oct. 22, 2020, 11 pages.
(Continued)

*Primary Examiner* — Peter G Leigh

(57) ABSTRACT

A circuit board assembly, a backplane interconnection system, and an electronic device are disclosed. The circuit board assembly includes a bracket and a circuit board, the circuit board is formed with a fastened part and a free part, the fastened part is connected to the bracket, the free part is suspended, a surface on which the free part and the fastened part are co-located is a first plane, the free part has an amplitude of swing in a first direction, the first direction is perpendicular to the first plane, the circuit board is configured to plug-connect to a front sub-circuit board, a first connector plug-connected to a first plug-connection end on the front sub-circuit board is disposed on the free part, and the amplitude of swing is capable of enabling the first connector to plug-connect to the first plug-connection end.

16 Claims, 12 Drawing Sheets

(58) Field of Classification Search
USPC .......................... 439/78; 361/749, 784, 785
See application file for complete search history.

(56) References Cited

U.S. PATENT DOCUMENTS

| | | | |
|---|---|---|---|
| 10,020,603 B1* | 7/2018 | Liu | H01R 12/737 |
| 10,224,652 B2* | 3/2019 | Herring | H01R 12/737 |
| 2006/0223343 A1* | 10/2006 | Campini | H05K 7/1461 |
| | | | 439/64 |
| 2008/0032517 A1 | 2/2008 | Pai | |
| 2015/0173193 A1* | 6/2015 | Vanderveen | H01R 12/727 |
| | | | 361/784 |
| 2017/0162966 A1* | 6/2017 | Vanderveen | H01R 12/728 |
| 2019/0207342 A1* | 7/2019 | Aden | H01R 12/73 |

FOREIGN PATENT DOCUMENTS

| | | |
|---|---|---|
| CN | 205141189 U | 4/2016 |
| CN | 107287648 A | 10/2017 |
| CN | 110635274 A | 12/2019 |
| JP | H10134877 A | 5/1998 |

OTHER PUBLICATIONS

Office Action issued in CN201910791746.1, dated May 27, 2020, 6 pages.

* cited by examiner

CIRCUIT BOARD ASSEMBLY, BACKPLANE INTERCONNECTION SYSTEM, AND ELECTRONIC DEVICE

CROSS-REFERENCE TO RELATED APPLICATIONS

This application is a continuation of International Application No. PCT/CN2020/106487, filed on Aug. 1, 2020, which claims priority to Chinese Patent Application No. 201910791746.1, filed on Aug. 26, 2019. The disclosures of the aforementioned applications are hereby incorporated by reference in their entireties.

TECHNICAL FIELD

This application relates to the technical field of electronic products, and in particular, to a circuit board assembly, a backplane interconnection system, and an electronic device.

BACKGROUND

As signal transmission efficiency of an electronic device becomes increasingly high, a circuit system requires a more direct and efficient interconnection manner to transmit a high-speed signal. To meet the requirement, manners of a direct connection between a subboard and a motherboard continuously appear in the fields of information technology (IT) and communication technology (CT). As shown in FIG. 1, FIG. 2, and FIG. 3, the circuit system includes a motherboard 001, a back-end subboard 005, and a front-end subboard 004. The motherboard 001 has a front-end subboard connector 002 and a back-end subboard connector 003. The front-end subboard 004 has a first port 006 plug-connected to the front-end subboard connector 002 on the motherboard 001. The back-end subboard 005 has a second port 007 plug-connected to the back-end subboard connector 003 on the motherboard 001. The motherboard 001 and the front-end subboard 004 are orthogonally connected.

In specific implementation, the motherboard 001 is first fastened in a chassis or another module, and then the first port 006 of the front-end subboard 004 is correspondingly plug-connected to the front-end subboard connector 002. The first port 006 on the front-end subboard 004 possibly has a tolerance when being processed. In addition, for the corresponding front-end subboard connector 002 of the motherboard 001, because there is a board thickness tolerance of the motherboard, a crimping tolerance of the front-end subboard connector 002, a height tolerance of the front-end subboard connector 002, a positioning tolerance generated due to deformation of the motherboard 001, and a positioning tolerance generated when the motherboard 001 is mounted and fastened, the tolerance of the first port 006 may not match the tolerance of the front-end subboard connector 002. Consequently, the front-end subboard 004 cannot be plug-connected to the motherboard 001.

In the conventional technology, a solution shown in FIG. 2 is used to compensate for the tolerance of the first port 006. To be specific, metal springs 008 are disposed on two sides of the front-end subboard 004 in a height direction H of the front-end subboard 004, and the metal springs 008 have an arched structure. Through deformation of the metal springs 008 in the height direction H, a tolerance in the height direction is absorbed. However, this solution has the following technical problem: The metal spring plate 008 has a limited tolerance absorption capability, which is generally ±0.5 mm. Sometimes, the front-end subboard 004 still cannot be plug-connected to the motherboard 001. If the tolerance absorption capability of the metal spring plate 008 needs to be improved, a size of the metal spring plate 008 needs to be increased. The metal spring plate 008 can have an improved but still limited tolerance absorption capability. In addition, due to an increased size of the metal spring plate 008, a size of the entire front-end subboard 004 in the height direction is increased, a space occupied by the front-end subboard 004 is increased, and layout density of the front-end subboard 004 is reduced.

SUMMARY

Embodiments of this application provide a circuit board assembly, a backplane interconnection system, and an electronic device, with a main purpose of forming a free part having an amplitude of swing on a circuit board while ensuring layout density of a front sub-circuit board, so as to plug-connect a first connector mounted on the free part to a first plug-connection end on the front sub-circuit board.

To achieve the foregoing purpose, the embodiments of this application use the following technical solutions:

According to a first aspect, an embodiment of this application provides a circuit board assembly, including:
a bracket; and
a circuit board, where the circuit board is formed with a fastened part and a free part, the fastened part is connected to the bracket, the free part is suspended, a surface on which the free part and the fastened part are co-located is a first plane, the free part has an amplitude of swing in a first direction, the first direction is perpendicular to the first plane, the circuit board is configured to plug-connect to a front sub-circuit board, a first connector plug-connected to a first plug-connection end on the front sub-circuit board is disposed on the free part, and the amplitude of swing is capable of enabling the first connector to plug-connect to the first plug-connection end.

In the circuit board assembly provided in this embodiment, the circuit board is formed with the fastened part and the free part, the fastened part is mounted on the bracket, the free part is suspended, and the first connector is disposed on the free part. The free part has an amplitude of swing in a direction perpendicular to the first plane, so that the first connector also has an amplitude of swing in the direction perpendicular to the first plane, and the amplitude of swing is capable of enabling the first connector to plug-connect to the first plug-connection end, and a front sub-circuit board is plug-connected to the circuit board. A connection structure between the circuit board and the bracket forms a cantilever beam structure, which is partially fastened and partially suspended. Compared with the conventional technology, in the solutions provided by this application, the free part has a relatively large amplitude of swing, so that the circuit board has a relatively strong capability of compensating for a tolerance of the first plug-connection end, and no tolerance increasing structure needs to be disposed on the front sub-circuit board. This ensures that a size of the front sub-circuit board does not change, and further ensures layout density of the front sub-circuit board.

In a possible implementation of the first aspect, the fastened part is formed on a first end of the circuit board, the free part is formed on a second end of the circuit board, and the first end is opposite to the second end. In a specific implementation, the front sub-circuit board is usually connected to one end of the circuit board, so that one end of the circuit board is fastened, and the other end of the circuit board is suspended, so as to meet a common mounting requirement of the front sub-circuit board and the circuit board.

In a possible implementation of the first aspect, a plurality of first connectors arranged at intervals along an outer edge of the free part are disposed on the free part, and the circuit board has a slot between two adjacent first connectors. When a plurality of first connectors are disposed on the free part, that is, a plurality of front sub-circuit boards need to be plug-connected to a plurality of corresponding first connectors, tolerances of first plug-connection ends of two adjacent front sub-circuit boards may be different, and amplitudes of swing of the two adjacent first connectors need to be different. In this case, when a first plug-connection end of one of the front sub-circuit boards is plug-connected to a first connector, a plug-connection between the other front sub-circuit board and a first connector is affected, and even the entire circuit board is distorted. However, disposing the slot can prevent a plug-connection of a sideward first connector from being affected when each first connector is plug-connected to a front sub-circuit board.

In a possible implementation of the first aspect, the slot is provided at an outer edge of the circuit board, and the slot is a through slot in a thickness direction of the circuit board. The slot is disposed at the edge of the circuit board and is a through slot, so that a circuit board at which any first connector is located is an independent structure. In this way, a tolerance absorption capability of each first connector is further improved, so that tolerance absorption capabilities of two adjacent first connectors are greatly different.

In a possible implementation of the first aspect, the circuit board is connected to the bracket by using a fastener, a first positioning structure is disposed at a location at which the fastener cooperates with the bracket, and/or a second positioning structure is disposed at a location at which the fastener cooperates with the circuit board, the first positioning structure is configured to prevent the circuit board and the fastener from moving relative to the bracket in a direction perpendicular to the circuit board, and the second positioning structure is configured to prevent the circuit board from moving relative to the fastener in a direction parallel to the circuit board. The first positioning structure is disposed to ensure that a second sub-circuit board to be plug-connected to the circuit board can be accurately plug-connected to the circuit board, and the second positioning structure is disposed to ensure that the first sub-circuit board can be accurately plug-connected to the circuit board. This avoids a loose plug-connection or a failed plug-connection.

In a possible implementation of the first aspect, the first positioning structure includes a first positioning column disposed on the fastener and a first positioning hole provided on the bracket, an axial direction of the first positioning column is parallel to the circuit board, the second positioning structure includes a second positioning column disposed on the fastener and a second positioning hole provided on the circuit board, and an axial direction of the second positioning column is perpendicular to the circuit board. The first positioning structure and the second positioning structure have simple structures and simple manufacturing processes.

In a possible implementation of the first aspect, the fastener includes a first fastening plate and a second fastening plate, the first fastening plate and the second fastening plate are connected to form an L-shaped structure, the first fastening plate is detachably connected to the bracket by using a first connecting piece, and the second fastening plate is detachably connected to the circuit board by using a second connecting piece. The fastener is formed by using the first fastening plate and the second fastening plate, and has a simple structure. In addition, the first connecting piece and the second connecting piece are used to detachably connect the corresponding first fastening plate and second fastening plate, and an operation is simple.

In a possible implementation of the first aspect, the fastener further includes a reinforcing plate, where the reinforcing plate is disposed between the first fastening plate and the second fastening plate. The reinforcing plate is used to improve connection strength between the fastener and both the bracket and the circuit board.

According to a second aspect, an embodiment of this application further provides a backplane interconnection system, including: a circuit board assembly and a front sub-circuit board, where the circuit board assembly is the circuit board assembly in the first aspect or any one of the implementations of the first aspect, the front sub-circuit board has the first plug-connection end that is plug-connected to the first connector disposed on the free part.

In the backplane interconnection system provided in this embodiment, because the circuit board assembly uses the circuit board assembly according to any one of the foregoing implementations of the first aspect, a circuit board in the circuit board assembly is formed with a fastened part and a free part, the fastened part is mounted and fastened on a bracket, the free part is suspended to form a cantilever beam structure, the first connector connected to the front sub-circuit board is disposed on the free part, and amplitudes of swing of the first connector and the free part can compensate for a tolerance of a first plug-connection end plug-connected to the first connector. In this way, an effective plug-connection between the front sub-circuit board and the circuit board can be implemented. Compared with the conventional technology, in the solution provided by this application, the circuit board is fastened by using the cantilever beam structure, and no tolerance increasing structure is disposed on the front sub-circuit board, so that no structure is added to make a structure of the front sub-circuit board complicated, and layout density of the front sub-circuit board is ensured.

In a possible implementation of the second aspect, the circuit board includes a first circuit board and a second circuit board that are stacked, the first circuit board and the second circuit board each is disposed with a plurality of first connectors, the front sub-circuit board includes a first front sub-circuit board, both the first circuit board and the second circuit board are connected to the first front sub-circuit board, the first plug-connection end is disposed at a location that is on the first front sub-circuit board and that is opposite to the first connector of the first circuit board, and the first plug-connection end is disposed at a location that is on the first front sub-circuit board and that is opposite to the first connector of the second circuit board. When the circuit board includes the first circuit board and the second circuit board, the first front sub-circuit board has first plug-connection ends respectively connected to the first circuit board and the second circuit board. Compared with the conventional technology, in the solution provided by this application, there is no need to dispose two sub-circuit boards respectively plug-connected to a corresponding first circuit board and a corresponding second circuit board. On the basis of implementing an interconnection between the first circuit board and the second circuit board, because both the first circuit board and the second circuit board have a free part, even if there is a tolerance between the two first plug-connection ends of the first front sub-circuit board, the first front sub-circuit board can still be simultaneously plug-connected to the first circuit board and the second circuit board.

In a possible implementation of the second aspect, the front sub-circuit board further includes a second front sub-circuit board stacked with the first front sub-circuit board, a direction in which the first circuit board and the second circuit board are stacked is perpendicular to a direction in which the first front sub-circuit board and the second front sub-circuit board are stacked, both the first circuit board and the second circuit board are connected to the second front sub-circuit board, a slot exists between two first connectors of the first circuit board that are configured to connect to the first front sub-circuit board and the second front sub-circuit board, and a slot exists between two first connectors of the second circuit board that are configured to connect to the first front sub-circuit board and the second front sub-circuit board. On the basis of implementing an interconnection between the first circuit board and the second circuit board and the first front sub-circuit board and the second front sub-circuit board, because a slot exists between two adjacent first connectors of the first circuit board, a plug-connection between the second front sub-circuit board and the first circuit board is not affected by a plug-connection between the first front sub-circuit board and the first circuit board. In addition, distortion of the entire first circuit board is avoided. Similarly, because a slot exists between two adjacent first connectors of the second circuit board, a plug-connection between the second front sub-circuit board and the second circuit board is not affected by a plug-connection between the first front sub-circuit board and the second circuit board. In addition, distortion of the entire second circuit board is avoided.

In a possible implementation of the second aspect, the system further includes a rear sub-circuit board, the rear sub-circuit board includes a first rear sub-circuit board and a second rear sub-circuit board that are stacked, a direction in which the first rear sub-circuit board and the second rear sub-circuit board are stacked is parallel to the direction in which the first circuit board and the second circuit board are stacked, the first rear sub-circuit board is connected to the first circuit board, the second rear sub-circuit board is connected to the second circuit board, and second connectors correspondingly connected to the first rear sub-circuit board and the second rear sub-circuit board are disposed on the fastened part of the first circuit board and the fastened part of the second circuit board. By disposing the first rear sub-circuit board and the second rear sub-circuit board, an interconnection between the first circuit board and the first rear sub-circuit board and an interconnection between the second circuit board and the second rear sub-circuit board are implemented. In addition, the second connector is disposed on the fastened part. Because the fastened part has rigidity, connection strength between the first rear sub-circuit board and the first circuit board and connection strength between the second rear sub-circuit board and the second circuit board are ensured.

In a possible implementation of the second aspect, the system further includes a centrally mounted connector, and the centrally mounted connector is configured to interconnect the first rear sub-circuit board and the second rear sub-circuit board. The centrally mounted connector is used to implement an interconnection between the first rear sub-circuit board and the second rear sub-circuit board.

In a possible implementation of the second aspect, the centrally mounted connector is further configured to interconnect the first circuit board and the second circuit board. The centrally mounted connector is used to implement an interconnection between the first circuit board and the second circuit board, and further implement an interconnection between the first circuit board and the second circuit board and the first rear sub-circuit board and the second rear sub-circuit board.

In a possible implementation of the second aspect, the centrally mounted connector includes a centrally mounted board, the centrally mounted board is disposed between the first circuit board and the first rear sub-circuit board, or is disposed between the second circuit board and the second rear sub-circuit board, second ports correspondingly connected to the first rear sub-circuit board and the second rear sub-circuit board are disposed on a side of the centrally mounted board facing the first rear sub-circuit board and the second rear sub-circuit board, and first ports correspondingly connected to the first circuit board and the second circuit board are disposed on a side of the centrally mounted board facing the first circuit board and the second circuit board. The centrally mounted board is used as the centrally mounted connector, a structure is simple, and implementation is convenient.

In a possible implementation of the second aspect, an avoidance slot is provided on a side of each of the first circuit board and the second circuit board that is near the centrally mounted board, and the centrally mounted board is disposed in the avoidance slot. The centrally mounted board is embedded into the avoidance slot to reduce a space occupied by the entire backplane interconnection system and further compact the entire backplane interconnection system.

In a possible implementation of the second aspect, the centrally mounted board is a flexible circuit board.

In a possible implementation of the second aspect, the centrally mounted connector includes a connection cable or a black box.

According to a third aspect, an embodiment of this application further provides an electronic device, including a chassis and a backplane interconnection system, the backplane interconnection system is disposed in the chassis, and the backplane interconnection system is the backplane interconnection system in the second aspect or any one of the implementations of the second aspect.

In the electronic device provided in this embodiment, the backplane interconnection system uses the backplane interconnection system according to any one of the implementations of the second aspect. Therefore, the electronic device provided in the embodiments of this application and the backplane interconnection system according to any one of the foregoing technical solutions can solve a same technical problem and achieve a same expected effect.

DESCRIPTION OF EMBODIMENTS

Embodiments of this application relate to a circuit board assembly, a backplane interconnection system, and an electronic device. The following describes the circuit board assembly, the backplane interconnection system, and the electronic device in detail with reference to the accompanying drawings.

Figure 6:
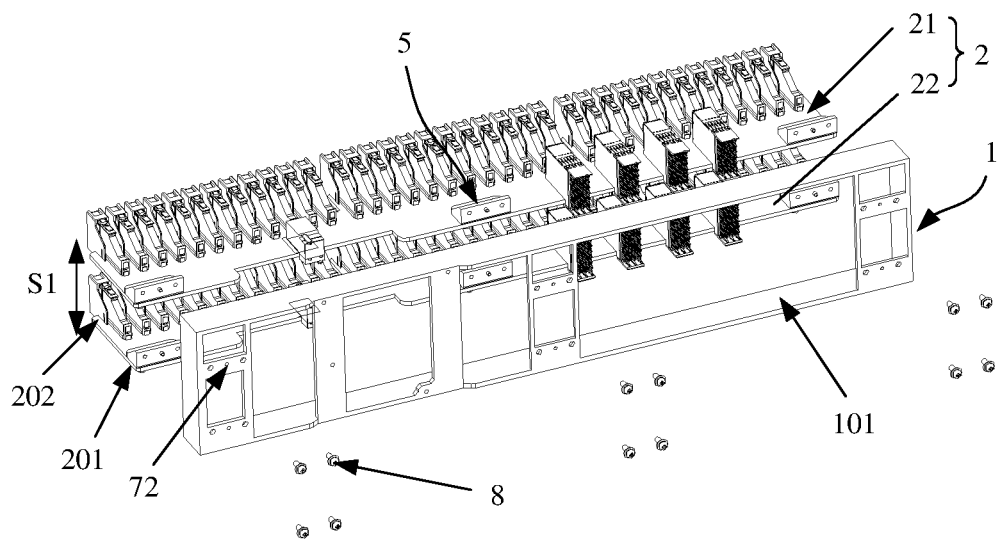
FIG. 6 is a schematic exploded view of a circuit board and a bracket in a circuit board assembly according to an embodiment of this application.
Figure 7:
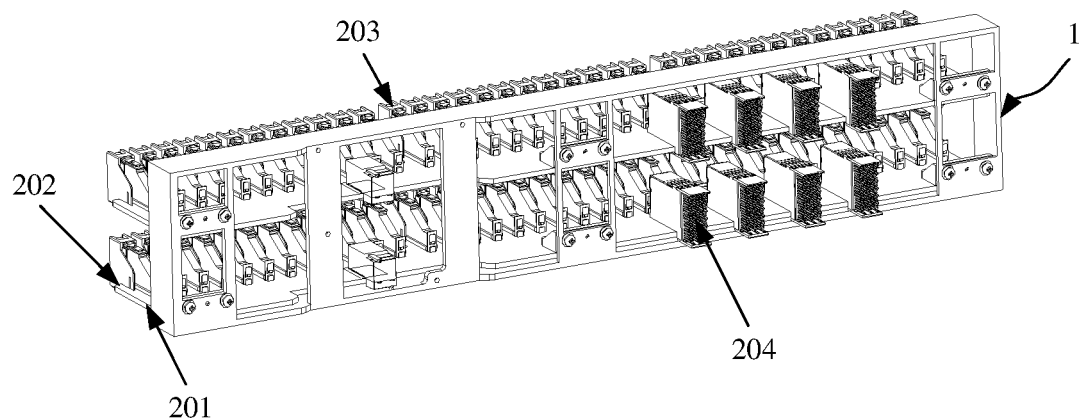
FIG. 7 is a schematic diagram of a connection relationship between a circuit board and a bracket in a circuit board assembly according to an embodiment of this application.
Figure 22:
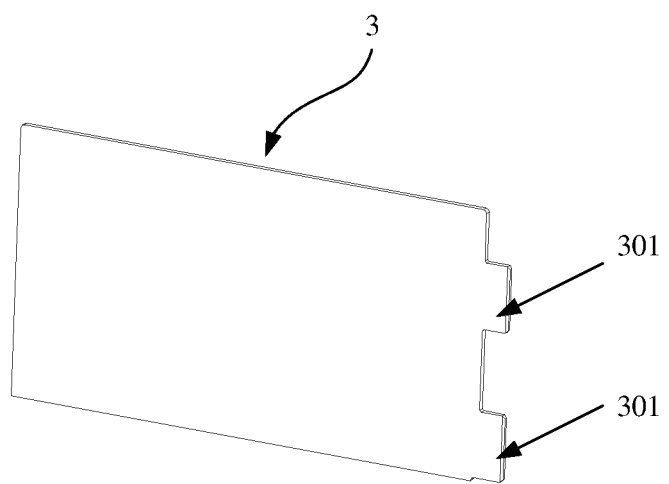
FIG. 22 is a schematic diagram depicting a structure of a front sub-circuit board according to an embodiment of this application.
Figure 23:
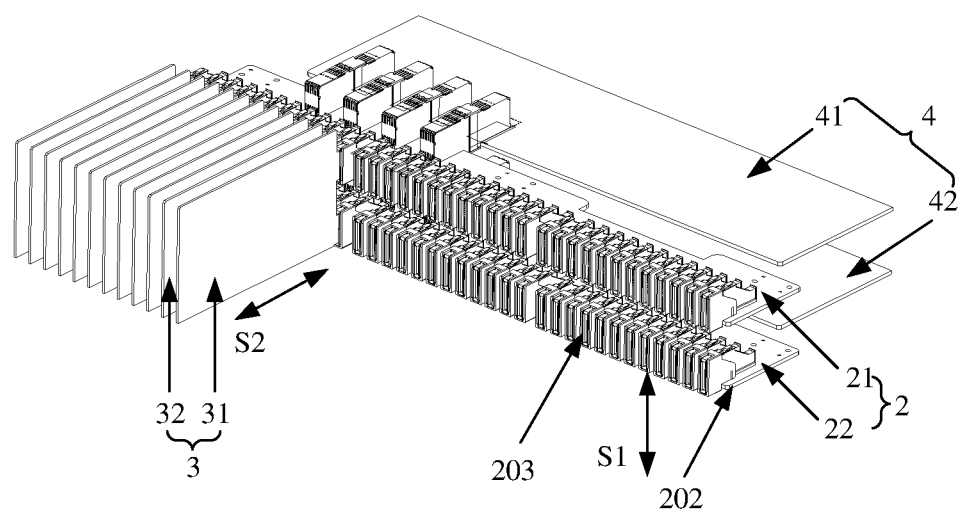
FIG. 23 is a schematic diagram depicting a structure of a backplane interconnection system according to an embodiment of this application.

As shown in FIG. 6 and FIG. 7, according to one aspect, an embodiment of this application provides a circuit board assembly, the circuit board assembly includes a bracket 1 and a circuit board 2, the circuit board 2 is formed with a fastened part 201 and a free part 202, the fastened part 201 is connected to the bracket 1, and the free part 202 is suspended. A surface on which the free part 202 and the fastened part 201 are co-located is a first plane, the free part 202 has an amplitude of swing in a first direction, and the first direction is perpendicular to the first plane. As shown in FIG. 22 and FIG. 23, the circuit board 2 is configured to plug-connect to a front sub-circuit board 3. A plug-connection direction of the front sub-circuit board 3 (an S2 direction shown in FIG. 23) is perpendicular to a swing direction of the free part 202 (an S1 direction shown in FIG. 23). A first connector 203 plug-connected to a first plug-connection end 301 on the front sub-circuit board 3 is disposed on the free part 202, and the amplitude of swing is capable of enabling the first connector 203 to plug-connect to the first plug-connection end 301.

The fastened part 201 of the circuit board 2 is mounted on the bracket 1, and the free part 202 is suspended. In this way, the free part 202 has an amplitude of swing, and the amplitude of swing is capable of enabling the first connector 203 to plug-connect to the first plug-connection end 301. That is, the amplitude of swing can compensate for a tolerance of the first plug-connection end 301 plug-connected to the first connector 203 in a direction perpendicular to the circuit board, so that the first plug-connection end 301 can be plug-connected to the first connector 203. It should be noted that a tolerance in this application refers to a tolerance of the first plug-connection end 301 in a direction perpendicular to the first plane. If it is assumed that an amplitude of swing of the first connector 203 when swinging upwardly in the first direction is an amplitude of swing A1, and the amplitude of swing A1 is greater than or equal to an upper deviation of the first plug-connection end 301, and if it is assumed that an amplitude of swing of the first connector 203 when swinging downwardly in the first direction is an amplitude of swing A2. The amplitude of swing A2 is greater than or equal to a lower deviation of the first plug-connection end 301. The circuit board assembly provided in this embodiment adopts a manner of fastening the circuit board 2 by using a cantilever beam structure. In this way, the free part 202 of the circuit board 2 has a relatively large amplitude of swing, and further has a relatively strong tolerance capability of accommodating the first plug-connection end, and no tolerance increasing structure is added on a first sub-circuit board of the circuit board assembly, so as to ensure layout density of the first sub-circuit board, and simplify a structure of the first sub-circuit board and an assembly process.

Figure 8:
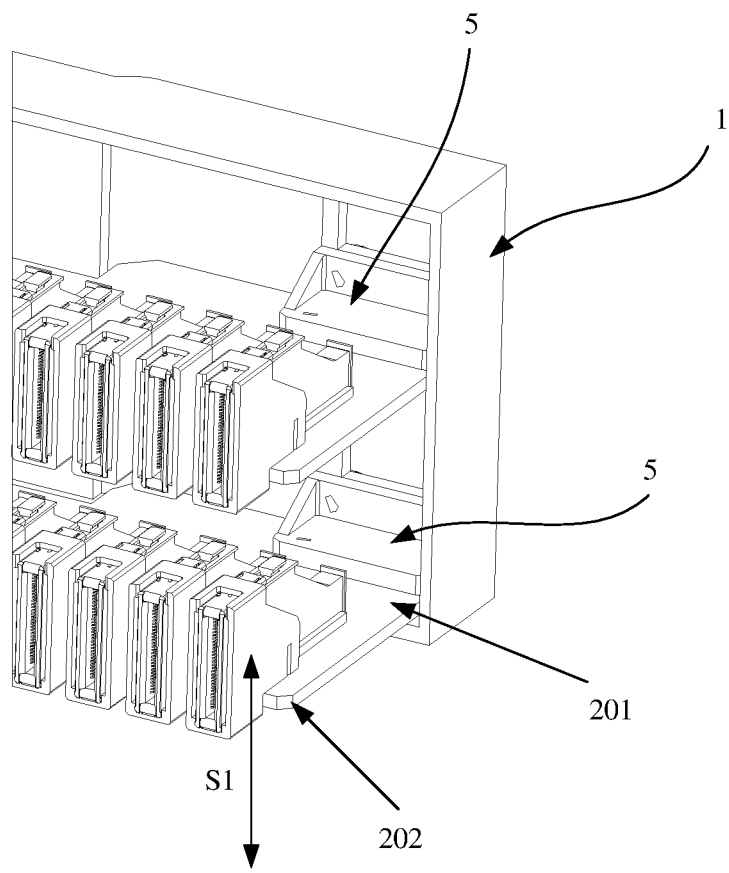
FIG. 8 is a partial schematic diagram of a circuit board and a bracket in a circuit board assembly according to an embodiment of this application.
Figure 9:
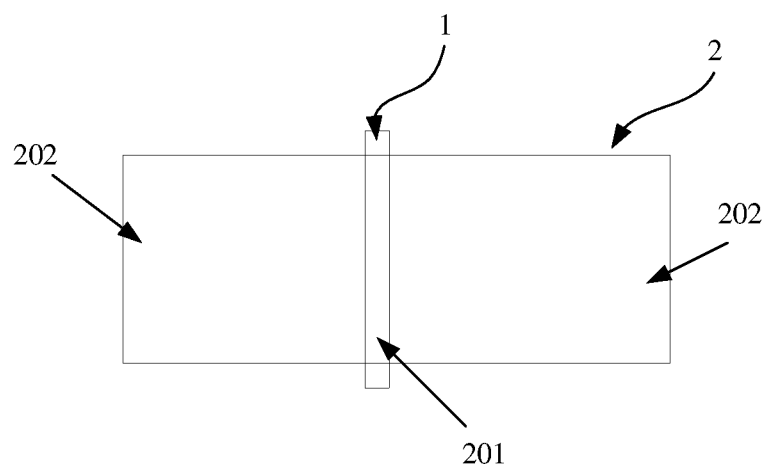
FIG. 9 is a schematic diagram of a connection relationship between a circuit board and a bracket in a circuit board assembly according to an embodiment of this application.

There are various locations on the circuit board 2 at which the fastened part 201 and the free part 202 are formed. As shown in FIG. 6, FIG. 7 and FIG. 8, in some implementations, the fastened part 201 is formed on a first end of the circuit board 2, the free part 202 is formed on a second end of the circuit board 2, and the first end is opposite to the second end. As shown in FIG. 9, in some other implementations, the fastened part 201 is formed in the middle of the circuit board 2, the free part 202 includes a first free part and a second free part, and the first free part and the second free part are located on two sides of the fastened part 201. In some other implementations, when the circuit board 2 is a circular circuit board, the fastened part 201 is located in the middle of the circular circuit board, and the free part 202 is located at an outer edge of the circular circuit board. Therefore, locations on the circuit board 2 at which the fastened part 201 and the free part 202 are formed are not limited in embodiments of this application.

Generally, a strip-shaped circuit board is selected as the circuit board. A first end of the circuit board 2 is formed with a fastened part, a second end of the circuit board 2 is formed with a free part, and the first end is opposite to the second end. This structure is a common structure.

In an example implementation, the circuit board 2 may need to connect to a plurality of front sub-circuit boards 3, so as to implement interconnections between the circuit board 2 and the plurality of front sub-circuit boards 3. As shown in FIG. 23, the free part 202 of the circuit board 2 needs to be disposed with a plurality of first connectors 203 disposed at intervals along an outer edge of the free part 202, and the plurality of first connectors 203 are correspondingly one-to-one connected to the plurality of front sub-circuit boards 3. For example, the front sub-circuit boards 3 include a first front sub-circuit board 31 and a second front sub-circuit board 32. That is, a first connector A is plug-connected to a first plug-connection end on the first front sub-circuit board 31, and a first connector B is plug-connected to a first plug-connection end on the second front sub-circuit board 32. In an actual plug-connection, a tolerance of the first plug-connection end on the first front sub-circuit board 31 may be different from a tolerance of the first plug-connection end on the second front sub-circuit board 32. If the first connector A is plug-connected to the first plug-connection end on the first front sub-circuit board 31 and the first connector B is plug-connected to the first plug-connection end on the second front sub-circuit board 32, an amplitude of swing of the first connector A is different from an amplitude of swing of the first connector B. As a result, the circuit board 2 is distorted. If the first front sub-circuit board 31 is removed from the first connector A, the first connector B shakes. This affects connection strength between the first connector B and the first plug-connection end on the second front sub-circuit board 32, or even causes detachment.

Figure 10:
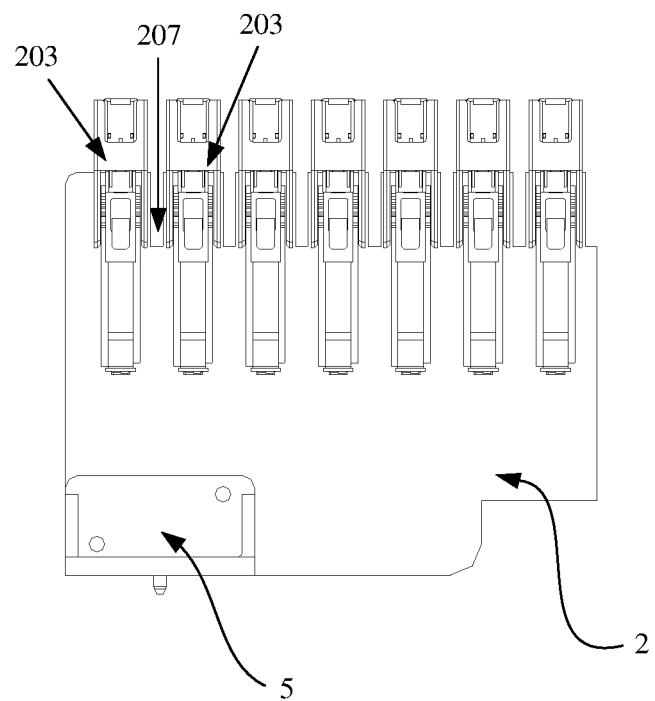
FIG. 10 is a partial schematic diagram of a circuit board in a circuit board assembly according to an embodiment of this application.

As shown in FIG. 10, the circuit board 2 has a slot 207 between two adjacent first connectors 203. The slot 207 is disposed so that amplitudes of swing of the two adjacent first connectors are different. In this way, when the circuit board is distorted and a first front sub-circuit board is removed, a phenomenon that a sideward second front sub-circuit board and the circuit board shake can be avoided.

Figure 11:
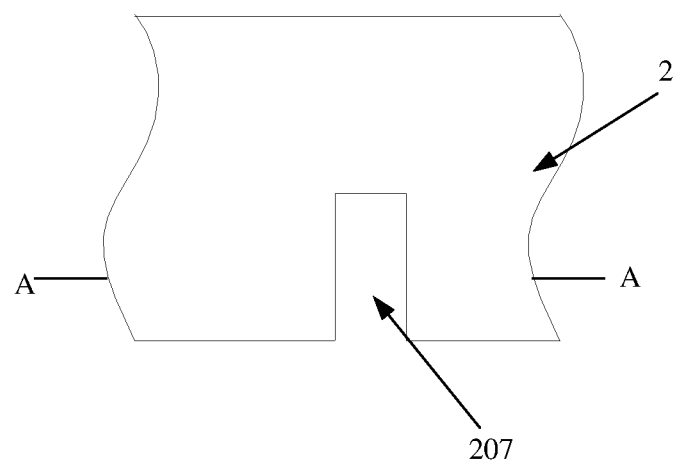
FIG. 11 is a top view of a circuit board in a circuit board assembly according to an embodiment of this application.
Figure 12:
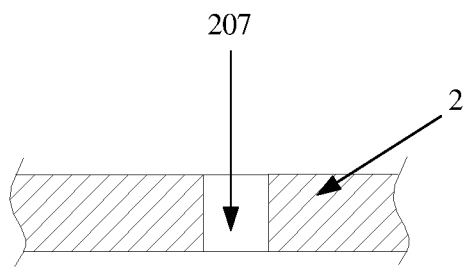
FIG. 12 is an A-A sectional view of FIG. 11.
Figure 13:
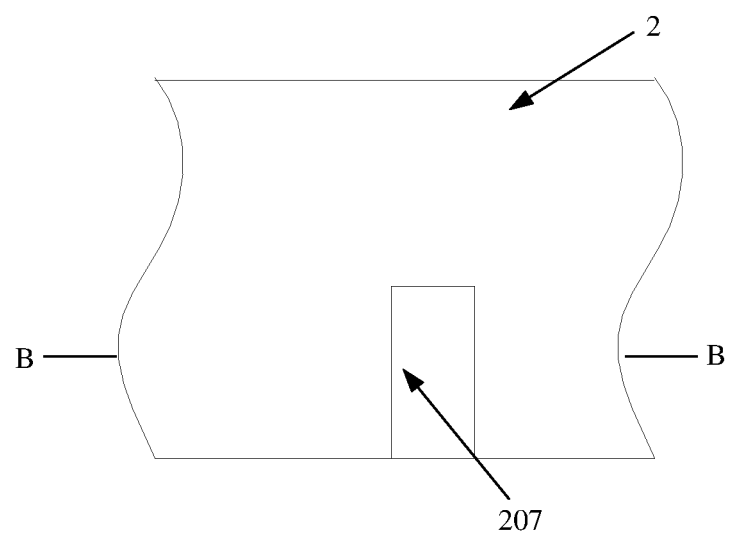
FIG. 13 is a top view of a circuit board in a circuit board assembly according to an embodiment of this application.
Figure 14:
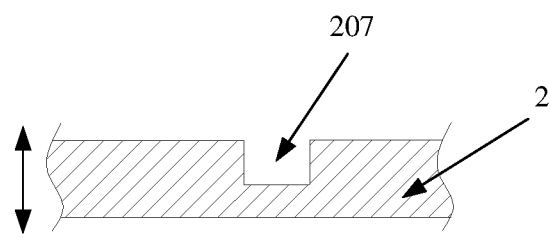
FIG. 14 is a B-B sectional view of FIG. 13.

The slot may have various structures. As shown in FIG. 11 and FIG. 12, in some implementations, the slot is disposed at an outer edge of the circuit board 2, and the slot is a through slot in a thickness direction of the circuit board 2. As shown in FIG. 13 and FIG. 14, in some other implementations, the slot is disposed at the outer edge of the circuit board 2, and the slot is a blind slot in the thickness direction of the circuit board 2. When the slot is a through slot in the thickness direction of the circuit board 2, that is, an outer edge of the free part 202 is in a sawtooth shape, a circuit board at which each first connector is located is an independent structure. In this way, a tolerance absorption capability of each first connector is further improved, so that tolerance absorption capabilities of two adjacent first connectors are greatly different. In some other implementations, the slot is located away from the outer edge of the circuit board and is a through slot in the thickness direction of the circuit board. In some other implementations, a thickness of a portion of the circuit board located between two adjacent first connectors is less than a thickness of a portion used to crimp the first connector. That is, the portion of the circuit board between two adjacent first connectors is relatively thin. In this way, amplitudes of swing of two adjacent first connectors can be different, so that accommodation capabilities are different. An example implementation of the present disclosure is that the slot is disposed at the outer edge of the circuit board 2, and the slot is a through slot in the thickness direction of the circuit board 2. Such a slot structure not only facilitates processing and manufacturing, but also further prevents distortion of the circuit board.

Figure 1:
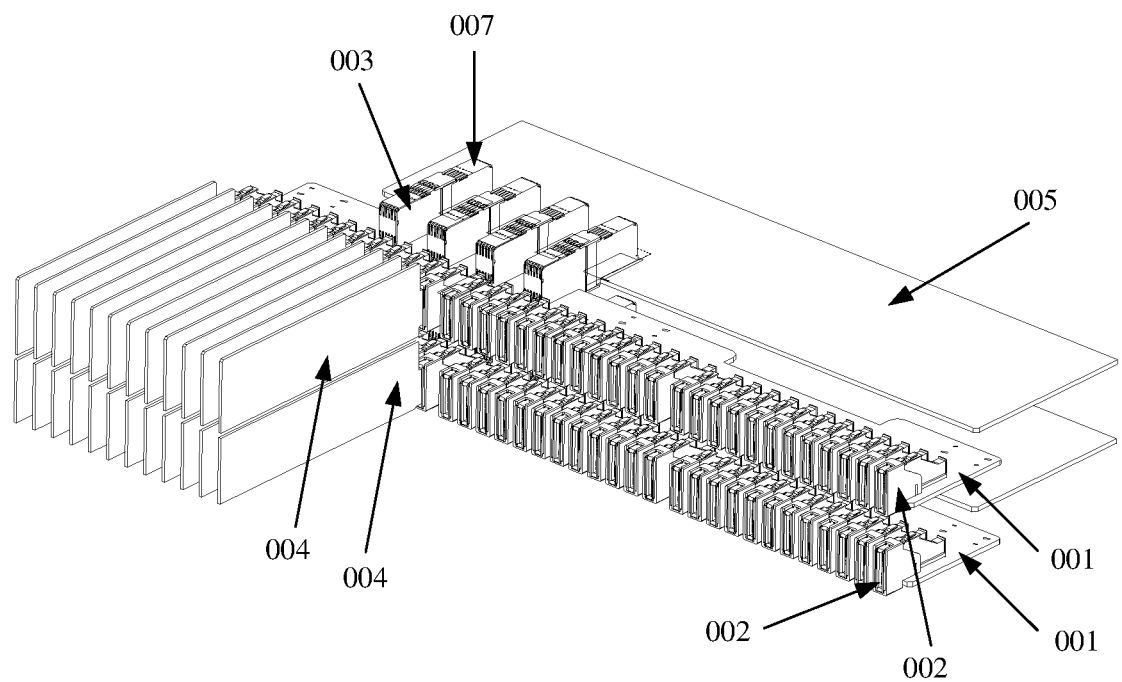
FIG. 1 is a schematic diagram depicting a structure of a backplane interconnection system in the conventional technology.
Figure 2:
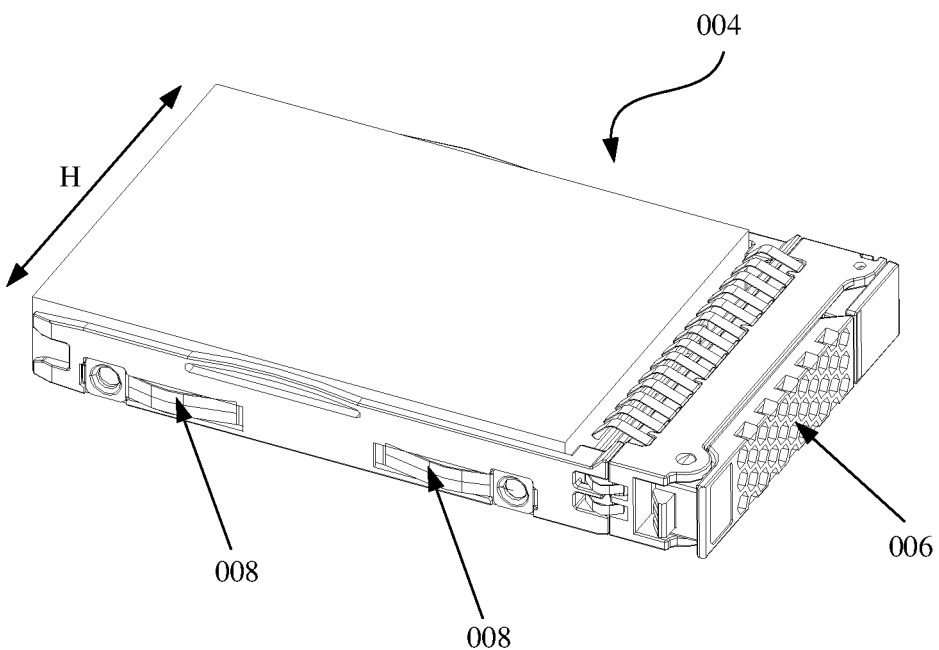
FIG. 2 is a schematic diagram depicting a structure of a front-end subboard in the conventional technology.
Figure 3:
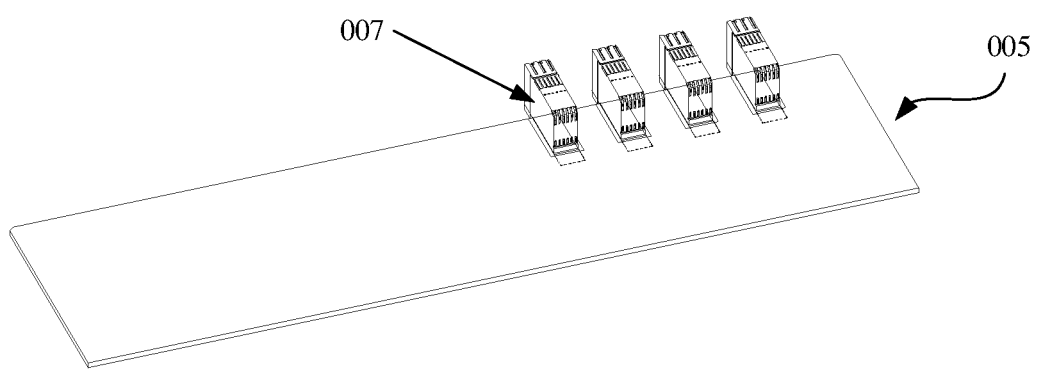
FIG. 3 is a schematic diagram depicting a structure of a back-end subboard in the conventional technology.
Figure 4:
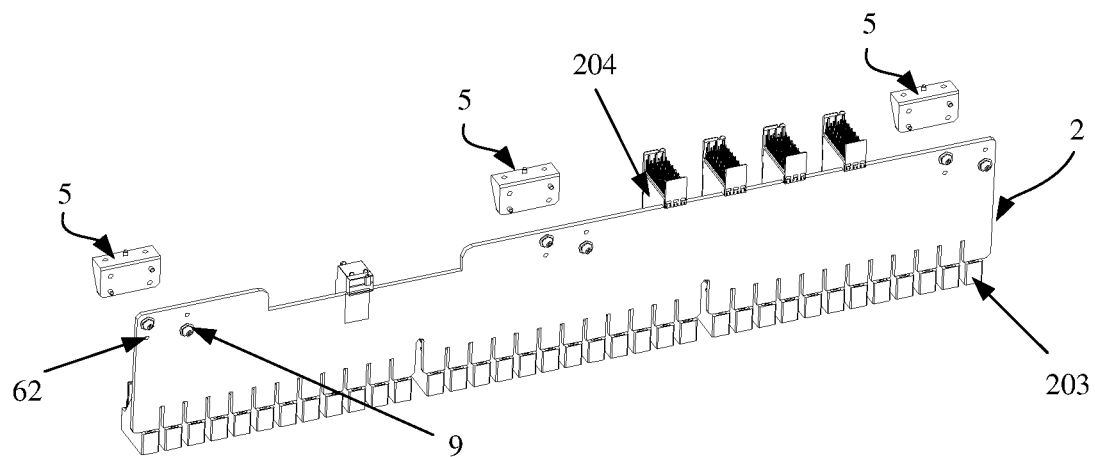
FIG. 4 is a schematic exploded view of a circuit board and a fastener in a circuit board assembly according to an embodiment of this application.
Figure 5:
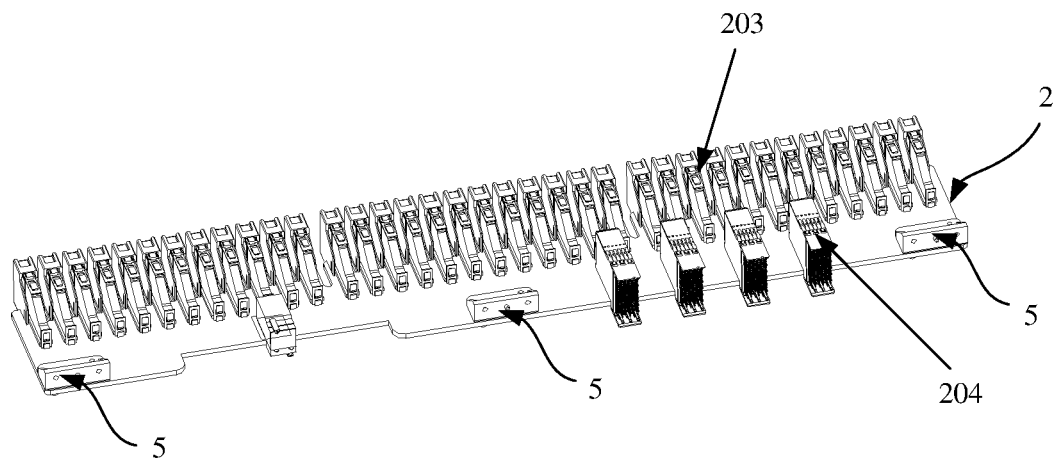
FIG. 5 is a schematic diagram of a connection relationship between a circuit board and a fastener in a circuit board assembly according to an embodiment of this application.

There are various connection structures between the circuit board 2 and the bracket 1. For example, as shown in FIG. 4, FIG. 5, and FIG. 6, the circuit board 2 is connected to the bracket 1 by using a fastener 5. To further ensure assembly precision of the circuit board and reduce an assembly tolerance between the first sub-circuit board and the circuit board, a second positioning structure is disposed at a location at which the fastener 5 cooperates with the circuit board 2. The second positioning structure is configured to prevent the circuit board 2 from moving relative to the fastener 5 in a direction parallel to the circuit board 2. Limited by the second positioning structure, relative locations of the circuit board 2 and the fastener 5 are maintained. To ensure assembly precision of the circuit board and a second sub-circuit board and reduce an assembly tolerance between the second sub-circuit board and the circuit board, a first positioning structure is disposed at a location at which the fastener 5 cooperates with the bracket 1. The first positioning structure is configured to prevent the circuit board 2 and the fastener 5 from moving relative to the bracket 1 in a direction perpendicular to the circuit board 2.

Figure 16:
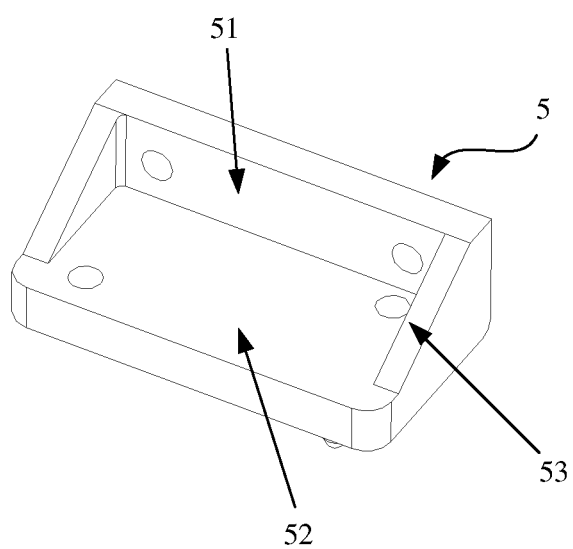
FIG. 16 is a schematic diagram depicting a structure of a fastener in a circuit board assembly according to an embodiment of this application.
Figure 17:
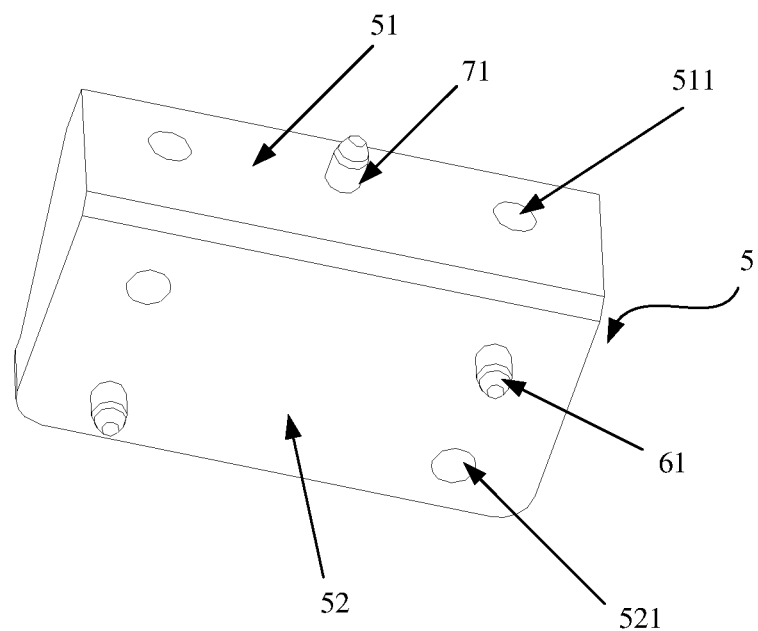
FIG. 17 is another perspective view of FIG. 16.

As shown in FIG. 16 and FIG. 17, in some implementations, the first positioning structure includes a first positioning column 71 disposed on the fastener 5 and a first positioning hole 72 provided on the bracket 1 (with reference to FIG. 6), and an axial direction of the first positioning column 71 is parallel to the circuit board 2. As shown in FIG. 16 and FIG. 17, the second positioning structure includes a second positioning column 61 disposed on the fastener 5 and a second positioning hole 62 provided on the circuit board 2 (with reference to FIG. 4), and an axial direction of the second positioning column 61 is perpendicular to the circuit board 2. The first positioning structure and the second positioning structure have simple structures, simple manufacturing processes, and convenient assembly.

As shown in FIG. 16 and FIG. 17, to simplify a structure and reduce manufacturing costs, the fastener 5 includes a first fastening plate 51 and a second fastening plate 52, the first fastening plate 51 and the second fastening plate 52 are connected to form an L-shaped structure, the first fastening plate 51 is detachably connected to the bracket 1 by using a first connecting piece 8 (as shown in FIG. 8), and the second fastening plate 52 is detachably connected to the circuit board 2 by using a second connecting piece 9 (as shown in FIG. 4). The fastener 5 is formed by using the first fastening plate 51 and the second fastening plate 52, and a structure and a manufacturing process are simple. In addition, the first fastening plate 51 and the second fastening plate 52 are detachably connected by using the corresponding first connecting piece 8 and second connecting piece 9, and an operation is simple. For example, the first connecting piece 8 and the second connecting piece 9 may use bolts or screws. As shown in FIG. 17, the first fastening plate 51 is provided with a first mounting hole 511 for the first connecting piece 8 to penetrate through, and the second fastening plate 52 is provided with a second mounting hole 521 for the second connecting piece 9 to penetrate through.

As shown in FIG. 17, to ensure connection strength between the first fastening plate 51 and the bracket 1 and a positioning result of the first positioning structure, two second positioning columns 61 and two second mounting holes 521 are disposed diagonally. The first positioning column 71 is disposed between first mounting holes 511.

As shown in FIG. 16, to improve stability of the fastener 5 and connection strength between the fastener 5 and the circuit board 2 and the bracket 1, the fastener 5 further includes a reinforcing plate 53, and the reinforcing plate 53 is connected between the first fastening plate 51 and the second fastening plate 52.

To improve connection strength between the circuit board 2 and the bracket 1, there may be a plurality of fasteners 5.

Figure 15:
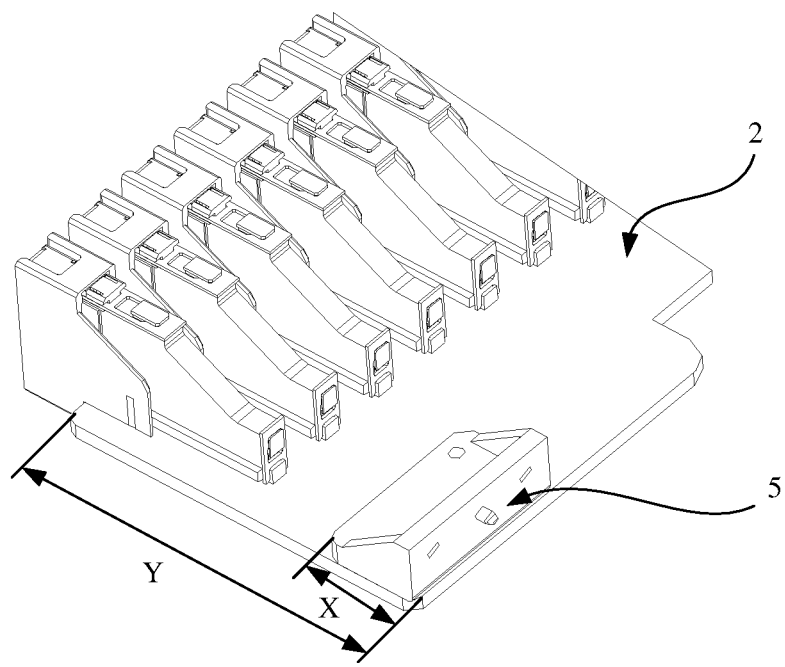
FIG. 15 is a partial schematic diagram of a circuit board in a circuit board assembly according to an embodiment of this application.

As shown in FIG. 15, to make the free part 202 of the circuit board 2 have a relatively large amplitude of swing, a width dimension X of the fastener 5 is much smaller than a width dimension Y of the circuit board 2, and in a cantilever beam structure formed in this way, the free part 202 and the first connector 203 have relatively large amplitudes of swing, and the circuit board further has a relatively strong tolerance capability.

As shown in FIG. 6, the bracket 1 includes a plurality of bezels 101, and the plurality of bezels 101 are sequentially connected head to tail to form a frame. To improve strength of the frame, a support plate is disposed in the frame. In addition, the bracket 1 may alternatively be in another structure. A specific structure of the bracket 1 is not limited in embodiments of the present disclosure, and the bracket may be any structure.

According to another aspect, an embodiment of this application further provides a backplane interconnection system. As shown in FIG. 22 and FIG. 23, the backplane interconnection system includes a front sub-circuit board 3 and the circuit board assembly provided in the foregoing embodiments. The front sub-circuit board 3 has a first plug-connection end 301. The first plug-connection end 301 is plug-connected to a first connector 203 on a circuit board 2, and a plug-connection direction of the front sub-circuit board 3 (an S2 direction) is perpendicular to a swing direction of a free part 202 (an S1 direction).

The backplane interconnection system includes the circuit board assembly provided in the foregoing embodiment, the circuit board 2 connected to the front sub-circuit board 3 is formed with a fastened part 201 and the free part 202, and the first connector 203 is disposed on the free part 202 that has an amplitude of swing. In this way, the first connector 203 also has an amplitude of swing, and the amplitude of swing is capable of enabling the first connector 203 to plug-connect to the first plug-connection end 301. That is, the amplitude of swing can compensate for a tolerance of the first plug-connection end 301 plug-connected to the first connector 203 in a direction perpendicular to the circuit board. In this way, the front sub-circuit board 3 can be effectively plug-connected to the circuit board 2. Compared with the conventional technology, in the solutions provided by this application, the front sub-circuit board 3 is not provided with a tolerance increasing structure such as a metal spring plate. This ensures layout density of the front sub-circuit board 3.

As shown in FIG. 23, in some implementations, the circuit board 2 includes a first circuit board 21 and a second circuit board 22 that are stacked, both the first circuit board 21 and the second circuit board 22 are disposed with a plurality of first connectors 203, the front sub-circuit board 3 includes a first front sub-circuit board 31, and both the first circuit board 21 and the second circuit board 22 are connected to the first front sub-circuit board 31. A first plug-connection end 301 is disposed at a location that is on the first front sub-circuit board 31 and that is opposite to a first connector 203 of the first circuit board 21, and a first plug-connection end 301 is disposed at a location that is on the first front sub-circuit board 31 and that is opposite to a first connector 203 of the second circuit board 22. That is, the first front sub-circuit board 31 is connected to both the first circuit board 21 and the second circuit board 22, so that the first circuit board 21, the second circuit board 22, and the first front sub-circuit board 31 are interconnected.

For example, the first circuit board 21 has a first connector P connected to the first front sub-circuit board 31, and the second circuit board 22 has a first connector Q connected to the first front sub-circuit board 31. The first front sub-circuit board 31 has a first plug-connection end P plug-connected to the first connector P and a first plug-connection end Q plug-connected to the first connector Q. In an example implementation, there may be a tolerance between the first plug-connection end P and the first plug-connection end Q. However, amplitudes of swing of the first connector P and the first connector Q are capable of enabling the first front sub-circuit board 31 to plug-connect to both the first circuit board 21 and the second circuit board 22.

It should be noted that the backplane interconnection system provided in this embodiment further includes a third circuit board or even more circuit boards. A quantity of circuit boards is not limited in embodiments of the present disclosure. When there are a plurality of circuit boards, corresponding first front sub-circuit boards also have a plurality of first plug-connection ends plug-connected to corresponding circuit boards.

As shown in FIG. 23, in some implementations, the front sub-circuit board 3 further includes a second front sub-circuit board 32 stacked with the first front sub-circuit board 31, and a direction in which the first circuit board 21 and the second circuit board 22 are stacked is perpendicular to a direction in which the first front sub-circuit board 31 and the second front sub-circuit board 32 are stacked. Both the first circuit board 21 and the second circuit board 22 are connected to the second front sub-circuit board 32, so as to implement orthogonality of the first front sub-circuit board 31 to the first circuit board 21 and the second circuit board 22, and orthogonality of the second front sub-circuit board 32 to the first circuit board 21 and the second circuit board 22. In this way, the second front sub-circuit board 32 is also interconnected with the first circuit board 21 and the second circuit board 22.

The second circuit board 22 has first connectors 203 respectively connected to the first front sub-circuit board 31 and the second front sub-circuit board 32. The second front sub-circuit board 32 also has first plug-connection ends respectively connected to the first circuit board 21 and the second circuit board 22. For example, the first circuit board 21 has a first connector P connected to the first front sub-circuit board 31, and the second circuit board 22 has a first connector Q connected to the first front sub-circuit board 31. The first front sub-circuit board 31 has a first plug-connection end P plug-connected to the first connector P and a first plug-connection end Q plug-connected to the first connector Q. The first circuit board 21 has a first connector M connected to the second front sub-circuit board 32, and the second circuit board 22 has a first connector N connected to the second front sub-circuit board 32. The second front sub-circuit board 32 has a first plug-connection end M plug-connected to the first connector M and a first plug-connection end N plug-connected to the first connector N.

A slot exists between the first connector P and the first connector M of the first circuit board 21, and a slot also exists between the first connector Q and the first connector N of the second circuit board 22, and the first plug-connection end P and the first connector P have a fit tolerance, the first plug-connection end Q and the first connector Q have a fit tolerance, the first plug-connection end M and the first connector M have a fit tolerance, or the first plug-connection end N and the first connector N have a fit tolerance. Therefore, when the first front sub-circuit board 31 and the second front sub-circuit board 32 are plug-connected specifically, a plug-connection between the first connector P and the first plug-connection end P does not affect a plug-connection between the first plug-connection end M and the first connector M, and a plug-connection between the first plug-connection end Q and the first connector Q does not affect a plug-connection between the first plug-connection end N and the first connector N. In this way, the first circuit board 21 and the second circuit board 22 are not distorted. Specifically, when the first connector P and the first plug-connection end P are removed, the first plug-connection end M and the first connector M will not shake, and connection strength between the first plug-connection end M and the first connector M is ensured.

It should be noted that the backplane interconnection system provided in this embodiment further includes a third front sub-circuit board or even more front sub-circuit boards. A quantity of front sub-circuit boards is not limited in embodiments of the present disclosure. When there are a plurality of front sub-circuit boards, corresponding first circuit boards and second circuit boards also have a plurality of first connectors plug-connected to corresponding front sub-circuit boards. As shown in FIG. 23, the backplane interconnection system further includes a rear sub-circuit board 4, the rear sub-circuit board 4 includes a first rear sub-circuit board 41 and a second rear sub-circuit board 42 that are stacked, a direction in which the first rear sub-circuit board 41 and the second rear sub-circuit board 42 are stacked is parallel to the direction in which the first circuit board 21 and the second circuit board 22 are stacked, and the first rear sub-circuit board 41 is connected to the first circuit board 21, and the second rear sub-circuit board 42 is connected to the second circuit board 22. In this way, the first rear sub-circuit board 41 is interconnected with the first circuit board 21, and the second rear sub-circuit board 42 is interconnected with the second circuit board 22.

It should be noted that the backplane interconnection system provided in this embodiment further includes a third rear sub-circuit board or even more rear sub-circuit boards. A quantity of rear sub-circuit boards is not limited in embodiments of the present disclosure, and each rear sub-circuit board is connected to a corresponding circuit board. As shown in FIG. 5, second connectors 204 correspondingly connected to the first rear sub-circuit board 41 and the second rear sub-circuit board 42 are disposed on a fastened part 201 of the first circuit board 21 and a fastened part 201 of the second circuit board 22. The second connectors 204 are disposed on the fastened parts 201 to ensure that the first circuit board and the second circuit board have relatively strong rigidity and positioning accuracy.

Figure 18:
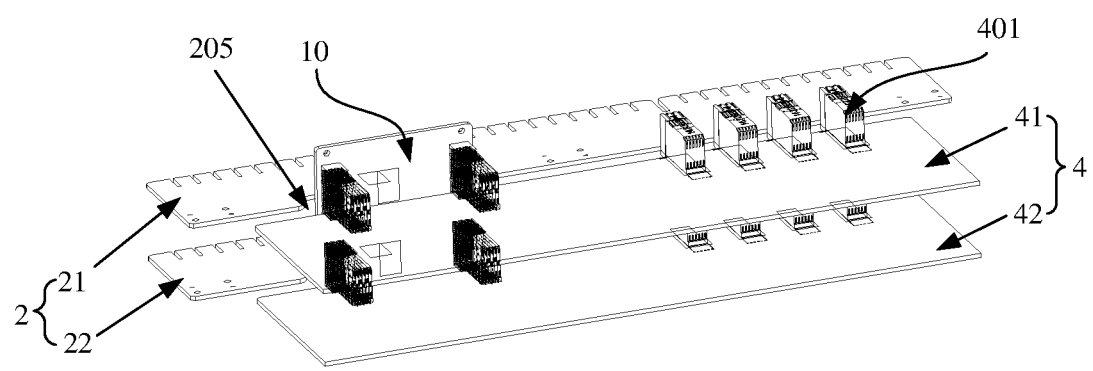
FIG. 18 is a schematic diagram of a connection relationship among a circuit board, a rear sub-circuit board, and a centrally mounted connector in a backplane interconnection system according to an embodiment of this application.

As shown in FIG. 18, the first rear sub-circuit board 41 is provided with a second plug-connection end 401 plug-connected to the second connector 204 on the first circuit board 21, and the second rear sub-circuit board 42 also has a second plug-connection end 401 plug-connected to the second connector 204 on the second circuit board 22.

Figure 19:
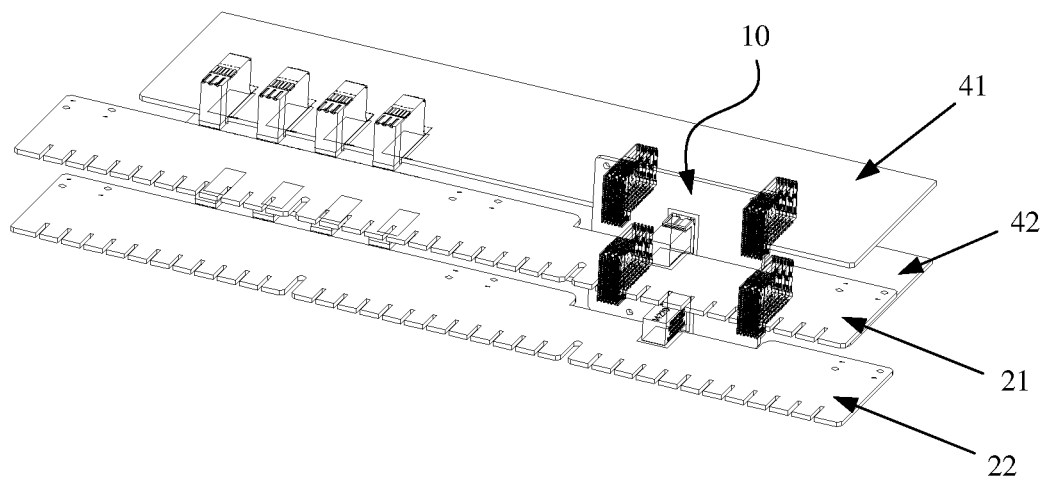
FIG. 19 is another perspective view of FIG. 18.

As shown in FIG. 18 and FIG. 19, to implement an interconnection between the first rear sub-circuit board 41 and the second rear sub-circuit board 42, the backplane interconnection system further includes a centrally mounted connector 10, and the centrally mounted connector 10 is configured to interconnect the first rear sub-circuit board 41 and the second rear sub-circuit board 42.

To implement an interconnection between the first circuit board 21 and the second circuit board 22, the centrally mounted connector 10 is further configured to interconnect the first circuit board 21 and the second circuit board 22.

The centrally mounted connector 10 has various implementation structures. For example, the centrally mounted connector 10 includes a centrally mounted backplane. In another example, the centrally mounted connector 10 includes a connection cable. In another example, the centrally mounted connector 10 includes a black box. The centrally mounted backplane may be a flexible backplane or a rigid backplane. A specific structure of the centrally mounted connector 10 is not limited in embodiments of the present disclosure, and the centrally mounted connector may be of any structure.

Figure 20:
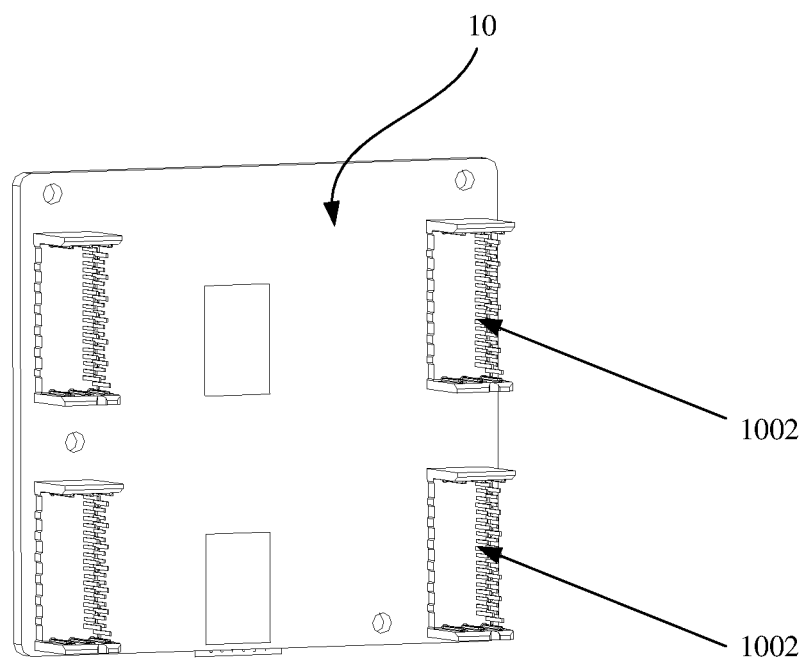
FIG. 20 is a schematic diagram depicting a structure of a centrally mounted board according to an embodiment of this application.
Figure 21:
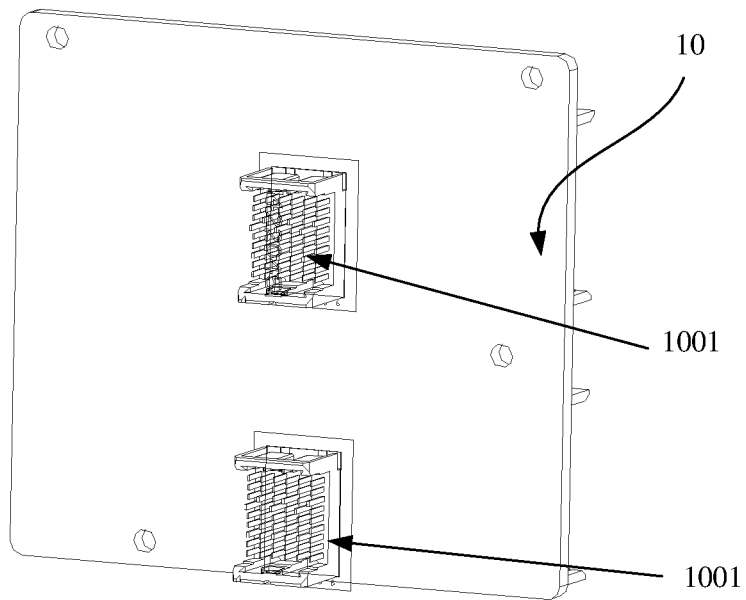
FIG. 21 is another perspective view of FIG. 20.

As shown in FIG. 20 and FIG. 21, the centrally mounted connector 10 includes a centrally mounted board. The centrally mounted board 10 is disposed between the first circuit board 21 and the first rear sub-circuit board 41, or is disposed between the second circuit board 22 and the second rear sub-circuit board 42. Second ports 1002 correspondingly connected to the first rear sub-circuit board 41 and the second rear sub-circuit board 42 are disposed on a side of the centrally mounted board 10 facing the first rear sub-circuit board 41 and the second rear sub-circuit board. First ports 1001 correspondingly connected to the first circuit board 21 and the second circuit board 22 are disposed on a side of the centrally mounted board 10 facing the first circuit board 21 and the second circuit board 22. In this way, the first rear sub-circuit board 41, the second rear sub-circuit board 42, the first circuit board 21, and the second circuit board 22 are interconnected. The centrally mounted board is used as the centrally mounted connector, a structure is simple, and implementation is convenient.

As shown in FIG. 18, to compact a structure of the entire backplane interconnection system and reduce a space occupied by the backplane interconnection system, an avoidance slot 205 is provided on a side of each of the first circuit board 21 and the second circuit board 22 that is near the centrally mounted board, and the centrally mounted board is disposed in the avoidance slot 205. Certainly, an avoidance slot may be provided on the centrally mounted board, and the first circuit board and the second circuit board are disposed in the avoidance slot.

According to another aspect, an embodiment of this application further provides an electronic device. The electronic device includes a chassis and a backplane interconnection system. The backplane interconnection system is the backplane interconnection system provided in the foregoing embodiment, and the backplane interconnection system is disposed in the chassis.

The electronic device includes the backplane interconnection system provided in the any one of the foregoing embodiments. Therefore, when a plurality of layers of front sub-circuit boards are interconnected with a plurality of layers of circuit boards, and a plurality of layers of rear sub-circuit boards are interconnected with a plurality of layers of circuit boards, the circuit board uses a cantilever beam structure, so that the circuit board has a relatively strong tolerance capability to ensure an effective plug-connection between the front sub-circuit board and the circuit board and ensure connection strength between the rear sub-circuit board and the circuit board. In particular, no tolerance increasing structure is added on the front sub-circuit board, so that a structure of the front sub-circuit board is simplified, an assembly process is simple, and layout density of the front sub-circuit board is ensured.

In the present disclosure, the described specific features, structures, materials, or characteristics may be combined in a proper manner in any one or more layers of the embodiments or examples.

The foregoing descriptions are merely non-limiting examples of specific implementations and are not intended to limit the protection scope, which is intended to cover any variation or replacement readily determined by a person of ordinary skill in the art. Therefore, the claims shall define the protection scope.

What is claimed is:

1. A circuit board assembly, comprising:
a bracket; and
a circuit board, wherein the circuit board is formed with a fastened part and a free part, the fastened part is connected to the bracket, the free part is suspended, a surface on which the free part and the fastened part are co-located is a first plane, the free part has an amplitude of swing in a first direction, the first direction is perpendicular to the first plane, the circuit board is configured to plug-connect to a front sub-circuit board, a first connector is plug-connected to a first plug-connection end on the front sub-circuit board and is disposed on the free part, and the amplitude of swing of the free part is capable of enabling the first connector to plug-connect to the first plug-connection end,
wherein the circuit board is connected to the bracket by using a fastener, a first positioning structure is disposed at a location at which the fastener cooperates with the bracket, and/or a second positioning structure is disposed at a location at which the fastener cooperates with the circuit board, the first positioning structure is configured to prevent the circuit board and the fastener from moving relative to the bracket in a direction perpendicular to the circuit board, and the second positioning structure is configured to prevent the circuit board from moving relative to the fastener in a direction parallel to the circuit board,
wherein the first positioning structure comprises a first positioning column disposed on the fastener and a first positioning hole provided on the bracket, an axial direction of the first positioning column is parallel to the circuit board, the second positioning structure comprises a second positioning column disposed on the fastener and a second positioning hole provided on the circuit board, and an axial direction of the second positioning column is perpendicular to the circuit board.

2. The circuit board assembly according to claim 1, wherein the fastened part is formed on a first end of the circuit board, the free part is formed on a second end of the circuit board, and the first end is opposite to the second end.

3. The circuit board assembly according to claim 1, wherein a plurality of first connectors is disposed at intervals along an outer edge of the free part, and the circuit board has a slot between two adjacent first connectors of the plurality of first connectors.

4. The circuit board assembly according to claim 3, wherein the slot is provided at an outer edge of the circuit board, and the slot is a through slot in a thickness direction of the circuit board.

5. The circuit board assembly according to claim 1, wherein the fastener comprises a first fastening plate and a second fastening plate, the first fastening plate and the second fastening plate are connected to form an L-shaped structure, the first fastening plate is detachably connected to the bracket by using a first connecting piece, and the second fastening plate is detachably connected to the circuit board by using a second connecting piece.

6. A backplane interconnection system, comprising:
a circuit board assembly; and
a front sub-circuit board, wherein the circuit board assembly comprises a bracket and a circuit board, wherein the circuit board is formed with a fastened part and a free part, the fastened part is connected to the bracket, the free part is suspended, a surface on which the free part and the fastened part are co-located is a first plane, the free part has an amplitude of swing in a first direction, the first direction is perpendicular to the first plane, the circuit board is configured to plug-connect to the front sub-circuit board, a first connector is plug-connected to a first plug-connection end on the front sub-circuit board and is disposed on the free part, and the amplitude of swing of the free part is capable of enabling the first connector to plug-connect to the first plug-connection end,
wherein the circuit board comprises a first circuit board and a second circuit board that are stacked, the first circuit board and the second circuit board each is disposed with at least one first connector, the front sub-circuit board comprises a first front sub-circuit board, both the first circuit board and the second circuit board are connected to the first front sub-circuit board, the first plug-connection end is disposed at a location that is on the first front sub-circuit board and that is opposite to the at least one first connector of the first circuit board, and the first plug-connection end is disposed at a location that is on the first front sub-circuit board and that is opposite to the at least one first connector of the second circuit board,
the backplane interconnection system further comprises a rear sub-circuit board, wherein the rear sub-circuit board comprises a first rear sub-circuit board and a second rear sub-circuit board that are stacked, a direction in which the first rear sub-circuit board and the second rear sub-circuit board are stacked is parallel to the direction in which the first circuit board and the second circuit board are stacked, the first rear sub-circuit board is connected to the first circuit board, the second rear sub-circuit board is connected to the second circuit board, and second connectors correspondingly connected to the first rear sub-circuit board and the second rear sub-circuit board are disposed on the fastened part of the first circuit board and the fastened part of the second circuit board.

7. The backplane interconnection system according to claim 6, wherein the front sub-circuit board further comprises a second front sub-circuit board stacked with the first front sub-circuit board, a direction in which the first circuit board and the second circuit board are stacked is perpendicular to a direction in which the first front sub-circuit board and the second front sub-circuit board are stacked, both the first circuit board and the second circuit board are connected to the second front sub-circuit board, a slot exists between two first connectors of the first circuit board that are configured to connect to the first front sub-circuit board and the second front sub-circuit board, and a slot exists between two first connectors of the second circuit board that are configured to connect to the first front sub-circuit board and the second front sub-circuit board respectively.

8. The backplane interconnection system according to claim 6, further comprising a centrally mounted connector, wherein the centrally mounted connector is configured to connect the first rear sub-circuit board and the second rear sub-circuit board.

9. The backplane interconnection system according to claim 8, wherein the centrally mounted connector is further configured to connect the first circuit board and the second circuit board.

10. The backplane interconnection system according to claim 9, wherein the centrally mounted connector comprises a centrally mounted board, the centrally mounted board is disposed between the first circuit board and the first rear sub-circuit board, or is disposed between the second circuit board and the second rear sub-circuit board, second ports correspondingly connected to the first rear sub-circuit board and the second rear sub-circuit board are disposed on a side of the centrally mounted board facing the first rear sub-circuit board and the second rear sub-circuit board, and first ports correspondingly connected to the first circuit board and the second circuit board are disposed on a side of the centrally mounted board facing the first circuit board and the second circuit board.

11. The backplane interconnection system according to claim 10, wherein an avoidance slot is provided on a side of each of the first circuit board and the second circuit board that is near the centrally mounted board, and the centrally mounted board is disposed in the avoidance slot.

12. An electronic device, comprising:
a chassis; and
a backplane interconnection system, wherein the backplane interconnection system is disposed in the chassis, and the backplane interconnection system comprises:
a circuit board assembly; and
a front sub-circuit board, wherein the circuit board assembly comprises a bracket and a circuit board, wherein the circuit board is formed with a fastened part and a free part, the fastened part is connected to the bracket, the free part is suspended, a surface on which the free part and the fastened part are co-located is a first plane, the free part has an amplitude of swing in a first direction, the first direction is perpendicular to the first plane, the circuit board is configured to plug-connect to the front sub-circuit board, a first connector is plug-connected to a first plug-connection end on the front sub-circuit board and is disposed on the free part, and the amplitude of swing of the free part is capable of enabling the first connector to plug-connect to the first plug-connection end,
wherein the circuit board comprises a first circuit board and a second circuit board that are stacked, the first circuit board and the second circuit board each is disposed with at least one first connector, the front sub-circuit board comprises a first front sub-circuit board, both the first circuit board and the second circuit board are connected to the first front sub-circuit board, the first plug-connection end is disposed at a location that is on the first front sub-circuit board and that is opposite to the at least one first connector of the first circuit board, and the first plug-connection end is disposed at a location that is on the first front sub-circuit board and that is opposite to the at least one first connector of the second circuit board,
the backplane interconnection system further comprises a rear sub-circuit board, wherein the rear sub-circuit board comprises a first rear sub-circuit board and a second rear sub-circuit board that are stacked, a direction in which the first rear sub-circuit board and the second rear sub-circuit board are stacked is parallel to the direction in which the first circuit board and the second circuit board are stacked, the first rear sub-circuit board is connected to the first circuit board, the second rear sub-circuit board is connected to the second circuit board, and second connectors correspondingly connected to the first rear sub-circuit board and the second rear sub-circuit board are disposed on the fastened part of the first circuit board and the fastened part of the second circuit board.

13. The electronic device according to claim 12, wherein the fastened part is formed on a first end of the circuit board, the free part is formed on a second end of the circuit board, and the first end is opposite to the second end.

14. The electronic device according to claim 12, wherein a plurality of first connectors is disposed at intervals along an outer edge of the free part, and the circuit board has a slot between two adjacent first connectors of the plurality of first connectors.

15. The electronic device according to claim 14, wherein the slot is provided at an outer edge of the circuit board, and the slot is a through slot in a thickness direction of the circuit board.

16. The electronic device according to claim 12, wherein the circuit board is connected to the bracket by using a fastener, a first positioning structure is disposed at a location at which the fastener cooperates with the bracket, and/or a second positioning structure is disposed at a location at which the fastener cooperates with the circuit board, the first positioning structure is configured to prevent the circuit board and the fastener from moving relative to the bracket in a direction perpendicular to the circuit board, and the second positioning structure is configured to prevent the circuit board from moving relative to the fastener in a direction parallel to the circuit board.

* * * * *